(12) United States Patent
Sato

(10) Patent No.: US 9,404,949 B2
(45) Date of Patent: Aug. 2, 2016

(54) SHUNT RESISTANCE-TYPE CURRENT SENSOR

(71) Applicant: Yazaki Corporation, Minato-ku, Tokyo (JP)

(72) Inventor: Takashi Sato, Susono (JP)

(73) Assignee: Yazaki Corporation, Minato-ku, Tokyo (JP)

( * ) Notice: Subject to any disclaimer, the term of this patent is extended or adjusted under 35 U.S.C. 154(b) by 0 days.

(21) Appl. No.: 14/762,936

(22) PCT Filed: Jan. 21, 2014

(86) PCT No.: PCT/JP2014/051122
§ 371 (c)(1),
(2) Date: Jul. 23, 2015

(87) PCT Pub. No.: WO2014/115724
PCT Pub. Date: Jul. 31, 2014

(65) Prior Publication Data
US 2015/0355244 A1    Dec. 10, 2015

(30) Foreign Application Priority Data
Jan. 23, 2013   (JP) ................................. 2013-010027

(51) Int. Cl.
*G01R 19/32*    (2006.01)
*G01R 19/00*    (2006.01)
(Continued)

(52) U.S. Cl.
CPC ................ *G01R 19/32* (2013.01); *G01R 1/203* (2013.01); *G01R 19/0092* (2013.01); *G01R 31/3696* (2013.01)

(58) Field of Classification Search
USPC .............. 324/126, 105, 426, 713, 76.11, 120, 324/537, 601; 174/68.2, 266, 255, 260, 174/261, 262; 338/49, 322, 329; 439/83, 439/271, 620.22, 626; 361/624, 93.8, 760, 361/767, 86
See application file for complete search history.

(56) References Cited

U.S. PATENT DOCUMENTS

| | | | |
|---|---|---|---|
| 2003/0011355 A1* | 1/2003 | Skerritt ................... | G01R 1/203 324/117 R |
| 2009/0039836 A1* | 2/2009 | Asada ...................... | G01K 1/14 320/152 |

(Continued)

FOREIGN PATENT DOCUMENTS

| | | | | |
|---|---|---|---|---|
| JP | 2002015805 A | * | 1/2002 | ............. H01R 12/34 |
| JP | 2004-221160 A | | 8/2004 | |

(Continued)

OTHER PUBLICATIONS

Apr. 22, 2014—(PCT) Written Opinion of the International Searching Authority—PCT/JP2014/051122.

(Continued)

*Primary Examiner* — Melissa Koval
*Assistant Examiner* — Nasima Monsur
(74) *Attorney, Agent, or Firm* — Banner & Witcoff, Ltd.

(57) ABSTRACT

A shunt resistance-type current sensor is provided, in which a voltage detection terminal electrically connects a busbar and a circuit board. The voltage detection terminal may include a first extension piece that extends from a side edge of the busbar away from the circuit board. The voltage detection terminal may include a second extension piece that extends from the first extension piece in a direction toward the circuit board. The circuit board may be electrically connected to the busbar via a connection portion extending from the second extension piece. In one example, the connection portion may extend through the circuit board. Additionally, an intermediate portion may be disposed between and connect the first extension piece and the second extension piece such that a surface of the intermediate portion faces a surface of the circuit board.

4 Claims, 3 Drawing Sheets

(51) Int. Cl.
*G01R 31/36* (2006.01)
*G01R 1/20* (2006.01)

(56) References Cited

U.S. PATENT DOCUMENTS

2009/0071683 A1* 3/2009 Yasuda ............... H05K 1/0263
174/68.2
2014/0015515 A1 1/2014 Satou

FOREIGN PATENT DOCUMENTS

JP 2012-078328 A 4/2012
JP 2012-220249 A 11/2012

OTHER PUBLICATIONS

Apr. 22, 2014—International Search Report—Intl App PCT/JP2014/051122.

* cited by examiner

SHUNT RESISTANCE-TYPE CURRENT SENSOR

TECHNICAL FIELD

The present invention relates to a shunt resistance-type current sensor.

BACKGROUND ART

Conventionally, shunt resistance-type current sensors have been proposed which, to detect a pulse current, a large AC current, or the like, detects the magnitude of a measurement subject current by causing the measurement subject current to flow through a shunt resistance portion whose resistance is known and detecting a voltage drop across the shunt resistance portion. For example, a metal piece called a busbar may be used for power distribution in vehicles such as automobiles, in which case a portion of the busbar which functions as a current path is used as a shunt resistance portion. A circuit board is disposed over the busbar. To detect the magnitude of a measurement subject current flowing through the busbar, the circuit board is mounted with a voltage detection IC for detecting a voltage across the shunt resistance portion.

In shunt resistance-type current sensors of this type, the resistance of the shunt resistance portion may vary depending on the temperature. Therefore, shunt resistance-type current sensors detect a temperature of the shunt resistance portion and correct a resistance value according to the detected temperature. In particular, where the shunt resistance portion has a large temperature dependence coefficient, it is necessary to detect a temperature of the shunt resistance portion correctly. To this end, the circuit board that is mounted with the voltage detection IC for detecting a voltage drop and other components is also mounted with a temperature sensor (refer to Patent document 1).

PRIOR ART DOCUMENTS

Patent Documents

Patent document 1: JP-A-2012-78328

SUMMARY OF THE INVENTION

Problems to Be Solved by the Invention

Incidentally, there is a problem that the detection accuracy of the temperature sensor is low in the case where the distance between the busbar and the circuit board that is mounted with the temperature sensor is long. Where the circuit board and the busbar are connected to each other using voltage detection terminals, a ground terminal, etc., a related technique is known that these terminals and the busbar are formed so as to be integral with each other. However, the circuit board and the busbar may be spaced from each other too much depending on how the terminals are disposed.

The present invention has been made in view of the above problems, and an object of the invention is therefore to provide a shunt resistance-type current sensor in which a busbar and a circuit board that is mounted with a temperature sensor can be disposed close to each other.

Means for Solving the Problems

To solve the above problems, one aspect of the invention provides a shunt resistance-type current sensor comprising a busbar shaped into an approximately flat plate, a circuit board opposed to the busbar, a pair of voltage detection terminals that are integrally formed with the busbar and electrically connect the busbar and the circuit board, a voltage detector that is provided on the circuit board and detects a voltage applied to the circuit board through the pair of voltage detection terminals to detect a magnitude of a measurement subject current flowing through the busbar, and a temperature detector that is provided on the circuit board and detects a temperature of the busbar to allow the voltage detector to conduct a correction. It is preferable that each of the voltage detection terminals comprises: a first bent portion in which a portion extending from a side edge portion of the busbar is bent to such a direction as to go away from the circuit board, a second bent portion in which a portion extending from the first bent portion is bent toward the circuit board, and a connection portion which extends straightly from the second bent portion and has a tip portion that has been subjected to tapering for thickness reduction. It is preferable that the tip portions of the connection portions of the voltage detection terminals penetrate through the circuit board and the voltage detection terminals are thereby electrically connected to the circuit board.

As another aspect of the invention, the shunt resistance-type current sensor may further comprise a ground terminal that is integrally formed with the busbar and electrically connects the busbar and the circuit board. It is preferable that the ground terminal comprise a first bent portion in which a portion extending from a side edge portion of the busbar is bent to such a direction as to go away from the circuit board; a second bent portion in which a portion extending from the first bent portion is bent toward the circuit board; and a connection portion which extends straightly from the second bent portion and has a tip portion that has been subjected to tapering for thickness reduction; and that the tip portion of the connection portion of the ground terminal penetrate through the circuit board and the ground terminal thereby be electrically connected to the circuit board.

In the invention, each of the voltage detection terminals has the first bent portion in which the portion extending from the busbar is bent to such a direction as to go away from the circuit board. With this configuration, the second bent portion can be located at a position that is more distant from the circuit board (on the side of the busbar) than in the structure without the first bent portion. Thus, the clearance between the busbar and the circuit board can be reduced and hence the circuit board 20 which is mounted with a temperature sensor 35 can be set closer to the busbar.

Advantages of the Invention

The shunt resistance-type current sensor according to the invention provides an advantage that the busbar and the circuit board that is mounted with the temperature sensor can be disposed close to each other.

MODES FOR CARRYING OUT THE INVENTION

Figure 1:
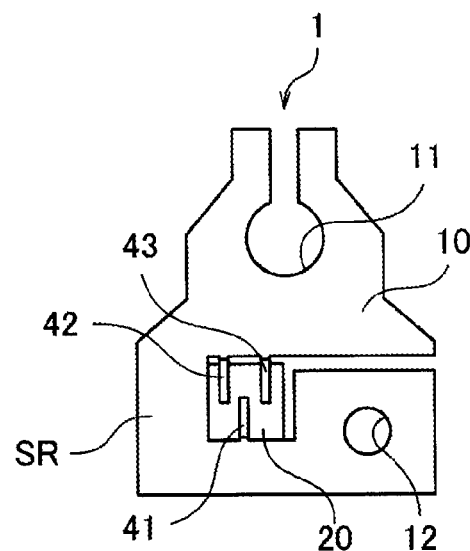
FIG. 1 is a schematic top view of a shunt resistance-type current sensor according to a first embodiment.
Figure 2:
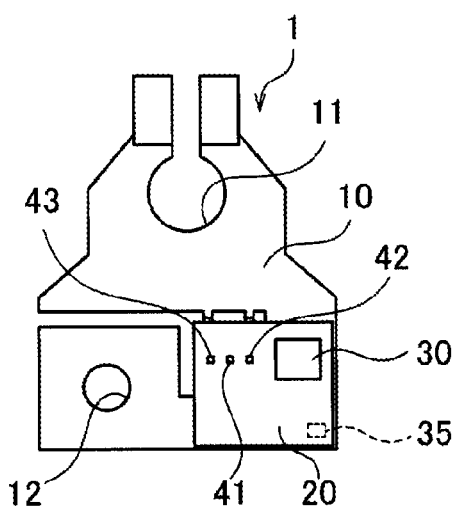
FIG. 2 is a schematic bottom view of the shunt resistance-type current sensor according to the first embodiment.
Figure 3:
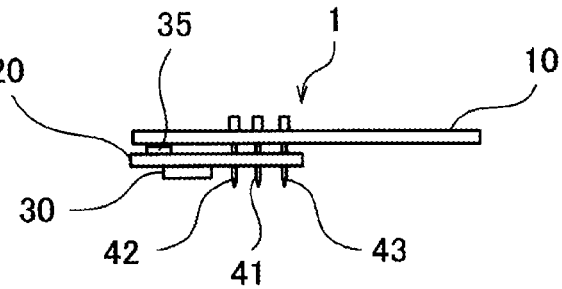
FIG. 3 is a schematic side view of the shunt resistance-type current sensor shown in FIG. 1.

FIG. 1 is a schematic top view of a shunt resistance-type current sensor 1 according to this embodiment. FIG. 2 is a schematic bottom view of the shunt resistance-type current sensor 1 according to the embodiment. FIG. 3 is a schematic side view of the shunt resistance-type current sensor 1 shown in FIG. 1 as viewed from below in the paper surface of FIG. 1. The shunt resistance-type current sensor 1 according to the embodiment is a shunt resistance-type current sensor that is used as a battery terminal, and is mainly composed of a busbar 10 and a circuit board 20. It is noted that the shunt resistance-type current sensor according to the invention is not limited to ones used as battery terminals.

The busbar 10 is a conductive member that is approximately shaped like a flat plate, and is made of a copper-manganese alloy, a copper-nickel alloy, or the like. The busbar 10 has a shunt resistance portion SR as its portion, and a measurement subject current is caused to flow through shunt resistance portion SR. The busbar 10 is given a desired shape by pressing a flat-plate-shaped steel material.

In the embodiment, the busbar 10 has approximately U-shape, for example, and through-holes 11 and 12 are formed through it on the two respective sides of the shunt resistance portion SR which is located at the center of the busbar 10. One through-hole 11 functions as a hole for a battery post, and the other through-hole 12 functions as a hole for fixing of a wire harness.

Figure 4:
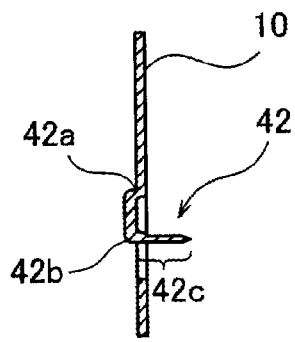
FIG. 4 is a schematic sectional view of a busbar.
Figure 5:
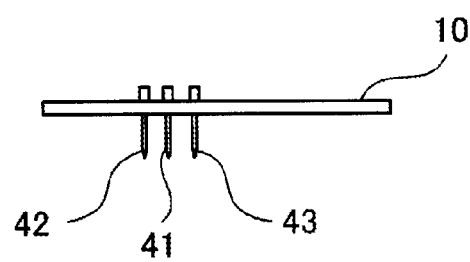
FIG. 5 is a schematic side view of the busbar.

FIG. 4 is a schematic sectional view of the busbar 10 of the shunt resistance-type current sensor 1. FIG. 5 is a schematic sectional view of the busbar 10 of the shunt resistance-type current sensor 1. The shunt resistance-type current sensor 1 is equipped with a pair of voltage detection terminals 41 and 42 that correspond to a positive pole and a negative pole, respectively, and each of the voltage detection terminals 41 and 42 electrically connects the circuit board 20 and the busbar 10. Where the shunt resistance-type current sensor 1 is attached to a negative-pole-side battery post 71, serving as a battery terminal, of a battery 70, one voltage detection terminal 41 corresponds to a positive-pole-side voltage detection terminal and the other voltage detection terminal 42 corresponds to a negative-pole-side voltage detection terminal. The voltage detection terminals 41 and 42 are formed at positions corresponding to the two respective ends of the shunt resistance portion SR. In the embodiment, the pair of voltage detection terminals 41 and 42 are formed so as to be integral with the busbar 10 and are, for example, formed simultaneously with the busbar 10 by pressing a flat-plate-shaped steal material.

Each of the voltage detection terminals 41 and 42 is an extension piece that extends from a side edge portion of the busbar 10. More specifically, as shown in FIG. 4, the voltage detection terminal 42 has a first bent portion 42a in which a portion extending from a side edge portion of the busbar 10 is bent to such a direction as to go away from the circuit board 20. In the embodiment, the first bent portion 42a is formed at a position that is immediately adjacent to the position at which the portion concerned extends from the busbar 10. In the voltage detection terminal 42, bending is again made in the first bent portion 42a so that a portion extending from it extends parallel with the busbar 10. The voltage detection terminal 42 also has a second bent portion 42b in which the portion extending from the first bent portion 42a is bent by about 90° toward the circuit board 20 at a position corresponding to the circuit board 20. A portion extending from the second bent portion 42b functions as a connection portion 42c. The connection portion 42c extends straightly and penetrates through the circuit board 20 (see FIG. 2). A tip portion of the connection portion 42c has been subjected to tapering (thickness reduction working), and hence its thickness decreases as the position goes toward its tip. The tapering is preprocessing for allowing the voltage detection terminal 42 to penetrate through the circuit board 20 by passing through a small hole that is formed through the circuit board 20. This preprocessing is performed at least prior to the bending in the second bent portion 42b.

The remaining voltage detection terminal 41 is formed in the same manner as the above-described voltage detection terminal 42 and a description therefor will be omitted. The voltage detection terminals 41 and 42 extend parallel with each other in opposite directions from the respective side edge portions of the busbar 10 that are opposed to each other.

The shunt resistance-type current sensor 1 is further equipped with a ground terminal 43, which electrically connects the busbar 10 and the circuit board 20. The ground terminal 43 is located so as to be more distant from the current path of a measurement subject current that flows through the busbar 10 (that is, from the shunt resistance portion SR) than the pair of voltage detection terminals 41 and 42. In the embodiment, the ground terminal 43 is located between the voltage detection terminal 42 and the through-hole 11 for a battery post.

The ground terminal 43 is an extension piece that extends from a side edge portion of the busbar 10. The ground terminal 43 is formed in the same manner as the voltage detection terminals 41 and 42, and a tip portion of its connection portion penetrates through the circuit board 20 (see FIG. 2).

Reference is again made to FIGS. 1 to 3. The circuit board 20 is opposed to the busbar 10 with a prescribed space formed between them. A pair of circuit patterns are formed on the circuit board 20. Ends of the pair of circuit patterns are connected to the connection portions 42c of the voltage detection terminals 41 and 42, respectively, which penetrate through the circuit board 20. The voltage detection terminals 41 and 42 are electrically connected to the respective circuit patterns by soldering, for example. Likewise, a ground pattern is formed on the circuit board 20. An end of the ground pattern is connected to the connection portion of the ground terminal 43 which penetrates through the circuit board 20 and projects to the side of its top surface.

A voltage detection IC 30 is mounted on the circuit board 20 and is connected to circuit patterns formed on the circuit board 20. A microcomputer that is mainly composed of a CPU, a ROM, a RAM, and an I/O interface may be used as the voltage detection IC 30. To detect the magnitude of a measurement subject current flowing through the busbar 10, the voltage detection IC 30 (voltage detector) detects voltages that are applied to the circuit board 20 via the pair of voltage detection terminals 41 and 42. More specifically, the voltage detection IC 30 detects a voltage drop across the shunt resistance portion SR of the busbar 10 and detects the magnitude of a measurement subject current on the basis of the voltage drop.

Furthermore, the voltage detection IC 30 makes a correction according to a detection result of a temperature sensor 35 (described later). More specifically, the voltage detection IC 30 corrects a resistance of the shunt resistance portion SR according to a temperature detection result to prevent detection of an erroneous current value due to influence of a resistance variation that is caused by a temperature variation.

The temperature sensor 35 is mounted on that surface of the circuit board 20 which is opposed to the shunt resistance portion SR of the busbar 10. In the embodiment, the temperature sensor 35 is mounted on that surface of the circuit board 20 which is opposite to its surface that is mounted with the voltage detection IC 30. As such, the temperature sensor 35 detects a temperature of the portion, opposed to itself, of the busbar 10 (shunt resistance portion SR). For example, the temperature sensor 35 is located at a position that corresponds to a central portion, in the current flowing direction, of the shunt resistance portion SR.

Figure 6:
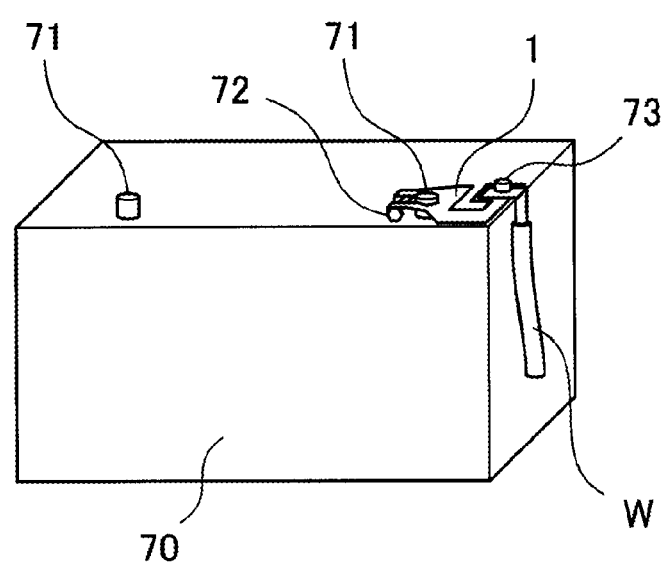
FIG. 6 schematically illustrates how the shunt resistance-type current sensor is used.

FIG. 6 schematically illustrates how the shunt resistance-type current sensor 1 according to the embodiment is used. The busbar 10 of the shunt resistance-type current sensor 1 according to the embodiment is used as a batter terminal. For example, the through-hole 11 of the busbar 10 is connected to a negative-pole-side battery post 71 of a battery 70 using a bolt 72 and the other through-hole 12 is connected to a wire harness W via a wire harness fixing screw 73.

As described above, in the embodiment, the voltage detection terminals 41 and 42 of the shunt resistance-type current sensor 1 are extension pieces that extend from side edge portions of the busbar 10. For example, as shown in FIG. 4, the voltage detection terminal 42 has the first bent portion 42a in which a portion extending from a side edge portion of the busbar 10 is bent to such a direction as to go away from the circuit board 20, the second bent portion 42b in which a portion extending from the first bent portion 42a is bent toward the circuit board 20, and the connection portion 42c which extends straightly from the second bent portion 42b and whose tip portion was subjected to tapering (thickness reduction working). The tip portions of the connection portions 42c penetrate through the circuit board 20, whereby the voltage detection terminals 41 and 42 are electrically connected to the circuit board 20.

Figure 7:
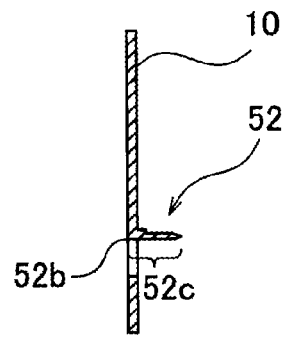
FIG. 7 illustrates a busbar having a terminal that is shaped so as not to have a first bent portion.
Figure 8:
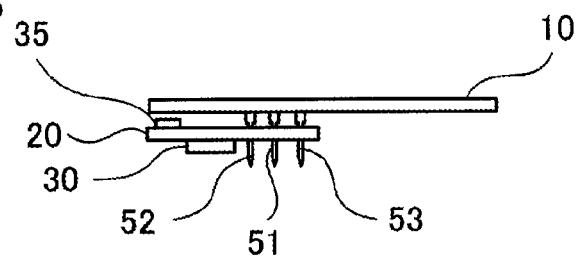
FIG. 8 illustrates a shunt resistance-type current sensor 1 that includes the busbar 10 shown in FIG. 7.

A comparative example for the embodiment will now be described. FIG. 7 illustrates a busbar 10 having a terminal that is shaped so as not to have the first bent portion 42a. FIG. 8 illustrates a shunt resistance-type current sensor 1 that includes the busbar 10 shown in FIG. 7. FIGS. 7 and 8 show a structure which employs a pair of voltage detection terminals 51 and 52 and a ground terminal 53 in place of the above-described pair of voltage detection terminals 41 and 42 and ground terminal 43. The terminals 51, 52, and 53 have the same shape. The shape of the voltage detection terminal 52 will be described below as an example.

The voltage detection terminal 52 is an extension piece that extends from a side edge portion of the busbar 10. More specifically, as shown in FIG. 7, the voltage detection terminal 52 has a second bent portion 52b in which a portion extending from a side edge portion of the busbar 10 is bent by about 90° toward the circuit board 20 at a position corresponding to the circuit board 20. A portion extending straightly from the second bent portion 52b functions as a connection portion 52c. A tip portion of the connection portion 52c penetrates through the circuit board 20. To make its tip portion thinner, the connection portion 52c has been subjected to tapering (thickness reduction working; press working).

When the tip portion of the connection portion 52c has been subjected to tapering, the portion that was subjected to the tapering working is hardened due to work hardening and it is difficult to bend the tip portion. Therefore, to form the second bent portion 42b, it is necessary to perform bending at a position of the voltage detection terminal 52 that is outside the portion that was subjected to the tapering working. This means that a wide portion that was not be subjected to the tapering remains in the connection portion 52c between the tip portion (subjected to the tapering) and the second bent portion 52b. In this case, the circuit board 20 through which the connection portion 52c penetrates can be set closer to the busbar 10 to such an extent as to reach the wide portion, not subjected to the tapering, of the connection portion 52c. However, as shown in FIG. 8, since the bending is done at the position that is outside the portion that was subjected to the tapering, a clearance that corresponds to the height of the wide portion of the connection portions 52c exists between the circuit board 20 and the busbar 10. This increases the distance between the busbar 10 and the temperature sensor 35.

In contrast, in the embodiment, the voltage detection terminal 42 has the first bent portion 42a in which the portion extending from the busbar 10 is bent to such a direction as to go away from the circuit board 20. As a result, the second bent portion 42b can be located at a position that is more distant from the circuit board 20 (on the side of the busbar 10) than in the structure without the first bent portion 42a. Thus, the clearance between the busbar 10 and the circuit board 20 can be reduced, that is, the circuit board 20 which is mounted with the temperature sensor 35 can be set closer to the busbar 10. This makes it possible to increase the temperature detection accuracy of the temperature sensor 35.

The height of that portion of the connection portion 42c which was subjected to the tapering, that is, its tip portion, does not affect the distance between the circuit board 20 and the busbar 10 as long as it is given such accuracy (in relation to the circuit board 20) as to be able to penetrate through the circuit board 20. Therefore, a long tip portion can be secured. In this case, by virtue of the thin shape produced by the working, heat is less prone to dissipate and soldering is facilitated accordingly. As a result, the efficiency of working is increased, which enables shortening of the manufacturing time and hence reduction of the production cost. Furthermore, when there occurs a difference in the degree of thermal expansion between the busbar 10 and the circuit board 20, deformation of the thin tip portion can reduce the stress that acts on the connecting portion, which can increase the reliability of soldered portions.

Having the same terminal shape as described above, each of the voltage detection terminal 41 and the ground terminal 43 is expected to provide the same workings and advantages as the voltage detection terminal 42.

(Embodiment 2)

Figure 9:
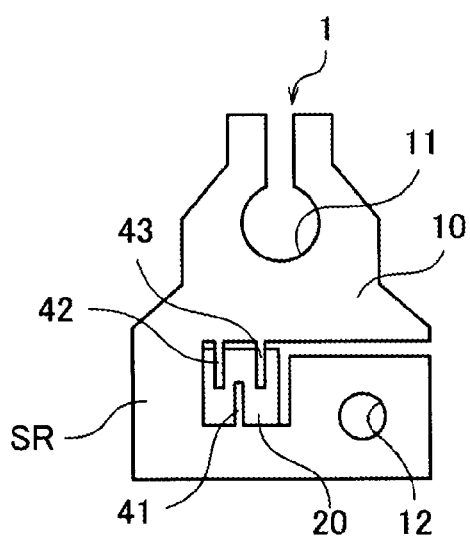
FIG. 9 is a schematic top view of a shunt resistance-type current sensor according to a second embodiment.
Figure 10:
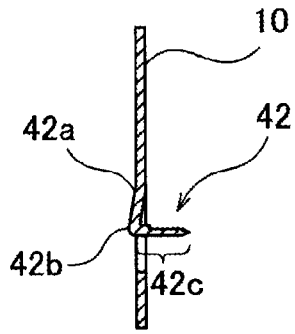
FIG. 10 is a schematic sectional view of a busbar of the shunt resistance-type current sensor shown in FIG. 9.

FIG. 9 is a schematic top view of a shunt resistance-type current sensor 1 according to this embodiment. FIG. 10 is a schematic sectional view of a busbar 10 of the shunt resistance-type current sensor 1 shown in FIG. 9. The shunt resistance-type current sensor 1 according to the second embodiment is different from that according to the first embodiment in the shape of each of the terminals 41, 42, and 43. The following description will mainly be directed to differences while descriptions for items common to the first embodiment will be omitted. The terminals 41, 42, and 43 have the same shape. The shape of the voltage detection terminal 42 will be described below as an example.

The voltage detection terminal 42 employed in the embodiment has a first bent portion 42a in which a portion extending from a side edge portion of the busbar 10 is bent to such a direction as to go away from the circuit board 20. The manner of bending in the first bent portion 42a is gentler than in the first embodiment. In the voltage detection terminal 42, a portion extending from the first bent portion 42a is inclined so as to go away from the busbar 10 gradually. The voltage detection terminal 42 also has a second bent portion 42b in which the portion extending from the first bent portion 42a is bent by about 90° toward the circuit board 20 at a position corresponding to the circuit board 20. A portion extending straightly from the second bent portion 42b is a connection portion 42c, and extends straightly and penetrates through the circuit board 20 (see FIG. 2). A portion (tip portion) of the connection portion 42c has been subjected to tapering (thickness reduction working; press working).

As mentioned above, in the embodiment, the voltage detection terminal 42 has the first bent portion 42a in which the portion extending from the side edge portion of the busbar 10 is bent to such a direction as to go away from the circuit board 20. With this measure, the second bent portion 42b can be located at a position that is more distant from the circuit board 20 (on the side of the busbar 10) than in the structure without the first bent portion 42a. Thus, the clearance between the busbar 10 and the circuit board 20 can be reduced, that is, the circuit board 20 which is mounted with the temperature sensor 35 can be set closer to the busbar 10. This makes it possible to increase the temperature detection accuracy of the temperature sensor 35.

Furthermore, the height of that portion of the connection portion 42c which was subjected to the tapering, that is, its tip portion, does not affect the distance between the circuit board 20 and the busbar 10 as long as it is given such accuracy (in relation to the circuit board 20) as to be able to penetrate through the circuit board 20. Therefore, a long tip portion can be secured. In this case, by virtue of the thin shape produced by the working, heat is less prone to dissipate and soldering is facilitated accordingly. As a result, the efficiency of working is increased, which enables shortening of the manufacturing time and hence reduction of the production cost. Furthermore, when there occurs a difference in the degree of thermal expansion between the busbar 10 and the circuit board 20, deformation of the thin tip portion can reduce the stress that acts on the connecting portion, which can increase the reliability of soldered portions.

Although the shunt resistance-type current sensors according to the embodiments have been described above, the invention is not limited to these embodiments and various modifications are possible within the scope of the invention.

The features of the shunt resistance-type current sensors according to the embodiments of the invention will be summarized below concisely as items [1] and [2]:

[1] A shunt resistance-type current sensor comprising:
a busbar shaped into an approximately flat plate;
a circuit board opposed to the busbar;
a pair of voltage detection terminals that are integrally formed with the busbar and electrically connect the busbar and the circuit board;
a voltage detector that is provided on the circuit board and detects a voltage applied to the circuit board through the pair of voltage detection terminals to detect a magnitude of a measurement subject current flowing through the busbar; and
a temperature detector that is provided on the circuit board and detects a temperature of the busbar to allow the voltage detector to conduct a correction,
wherein each of the voltage detection terminals comprises:
a first bent portion in which a portion extending from a side edge portion of the busbar is bent to such a direction as to go away from the circuit board;
a second bent portion in which a portion extending from the first bent portion is bent toward the circuit board; and
a connection portion which extends straightly from the second bent portion and has a tip portion that has been subjected to tapering for thickness reduction; and
wherein the tip portions of the connection portions of the voltage detection terminals penetrate through the circuit board and the voltage detection terminals are thereby electrically connected to the circuit board.

[2] The shunt resistance-type current sensor according to item [1], further comprising:
a ground terminal that is integrally formed with the busbar and electrically connects the busbar and the circuit board,
wherein the ground terminal comprises:
a first bent portion in which a portion extending from a side edge portion of the busbar is bent to such a direction as to go away from the circuit board;
a second bent portion in which a portion extending from the first bent portion is bent toward the circuit board; and
a connection portion which extends straightly from the second bent portion and has a tip portion that has been subjected to tapering for thickness reduction; and
wherein the tip portion of the connection portion of the ground terminal penetrates through the circuit board and the ground terminal is thereby electrically connected to the circuit board.

Although the invention has been described in detail by referring to the particular embodiments, it is apparent to those skilled in the art that various changes and modifications are possible without departing from the spirit and scope of the invention.

The present application is based on Japanese Patent Application No. 2013-10027 filed on Jan. 23, 2013, the disclosure of which is incorporated herein by reference.

INDUSTRIAL APPLICABILITY

The shunt resistance-type current sensor according to the invention provides the advantage that the busbar and the circuit board that is mounted with the temperature sensor can be disposed close to each other. With this advantage, the invention is useful in the field of shunt resistance-type current sensors.

DESCRIPTION OF SYMBOLS

1: Shunt resistance-type current sensor
10: Busbar
11: Through-hole
12: Through-hole
20: Circuit board
30: Voltage detection IC
41: Voltage detection terminal
42: Voltage detection terminal
42a: First bent portion
42b: Second bent portion
42c: Connection portion
43: Ground terminal
70: Battery
71: Battery post
72: Bolt
73: Wire harness fixing screw
SR: Shunt resistance portion
W: Wire harness

The invention claimed is:

1. A shunt resistance-type current sensor comprising:
    a busbar having an approximately flat plate shape, the busbar having a first surface facing in a first direction and a second surface facing in a second direction opposite to the first direction;
    a circuit board opposed to the busbar, the first surface of the busbar facing the circuit board in the first direction;
    a plurality of voltage detection terminals integrally formed with the busbar and configured to electrically connect the busbar and the circuit board;
    a voltage detector provided on the circuit board and configured to detect a voltage applied to the circuit board through the plurality of voltage detection terminals to detect a magnitude of a measurement subject current flowing through the busbar; and
    a temperature detector provided on the circuit board and configured to detect a temperature of the busbar to allow the voltage detector to conduct a correction,
    wherein each of the voltage detection terminals comprises:
        a first bent portion extending from a side edge portion of the busbar in a first bent direction away from the circuit board;
        a second bent portion in which a portion extending from the first bent portion is bent in a second bent direction toward the circuit board;
        an intermediate portion between and connecting the first bent portion and the second bent portion, wherein a surface of the intermediate portion faces a surface of the circuit board in the first direction, and wherein a distance, in the first direction, between the surface of the intermediate portion and the surface of the circuit board is greater than a distance, in the first direction, between the first surface of the busbar and the surface of the circuit board; and
        a connection portion which extends straightly from the second bent portion and has a tip portion, and
    wherein the tip portions of the connection portions of the voltage detection terminals penetrate through the circuit board, thereby electrically connecting the voltage detection terminals to the circuit board.

2. The shunt resistance-type current sensor according to claim 1, further comprising:
    a ground terminal integrally formed with the busbar and configured to electrically connect the busbar and the circuit board,
    wherein the ground terminal comprises:
        a first bent portion in which a portion extending from the busbar is bent in the first bent direction away from the circuit board;
        a second bent portion in which a portion extending from the first bent portion is bent in the second bent direction toward the circuit board; and
        a connection portion which extends straightly from the second bent portion and has a tip portion, and
    wherein the tip portion of the connection portion of the ground terminal penetrates through the circuit board, thereby electrically connecting the ground terminal to the circuit board.

3. The shunt resistance-type current sensor according to claim 1, wherein the tip portion of the connection portion of each of the voltage detection terminals has a tapered shape.

4. The shunt resistance-type current sensor according to claim 2, wherein the tip portion of the connection portion of the ground terminal has a tapered shape.

* * * * *